United States Patent
Yu et al.

(10) Patent No.: US 11,121,345 B2
(45) Date of Patent: Sep. 14, 2021

(54) STRUCTURES AND METHODS OF OLED DISPLAY FABRICATION SUITED FOR DEPOSITION OF LIGHT ENHANCING LAYER

(71) Applicant: Applied Materials, Inc., Santa Clara, CA (US)

(72) Inventors: Gang Yu, Santa Barbara, CA (US); Chung-Chia Chen, New Taipei (TW); Wan-Yu Lin, Taipei (TW); Hyunsung Bang, Aschaffenburg (DE); Lisong Xu, San Jose, CA (US); Byung Sung Kwak, Portland, OR (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/696,971

(22) Filed: Nov. 26, 2019

(65) Prior Publication Data
US 2021/0159464 A1    May 27, 2021

(51) Int. Cl.
*H01L 51/52*    (2006.01)
*H01L 51/56*    (2006.01)

(52) U.S. Cl.
CPC .......... *H01L 51/5275* (2013.01); *H01L 51/56* (2013.01); *H01L 2251/5315* (2013.01)

(58) Field of Classification Search
CPC ................. H01L 51/5275; H01L 51/56; H01L 2251/5315
USPC .......................................................... 257/40
See application file for complete search history.

(56) References Cited

U.S. PATENT DOCUMENTS

| | | |
|---|---|---|
| 6,476,988 B1 | 11/2002 | Yudasaka |
| 8,227,269 B2 | 7/2012 | Chen et al. |
| 8,323,748 B2 | 12/2012 | Ling |
| 8,425,065 B2 | 4/2013 | Ravillisetty et al. |
| 9,099,575 B2 | 8/2015 | Medendorp, Jr. et al. |
| 9,111,464 B2 | 8/2015 | Bibl et al. |
| 9,224,978 B2 | 12/2015 | Jung et al. |
| 9,536,931 B2 | 1/2017 | Kim et al. |
| 2003/0222267 A1 | 12/2003 | Kim et al. |
| 2005/0258441 A1* | 11/2005 | Shitagami ........... H01L 27/0248 257/88 |

(Continued)

FOREIGN PATENT DOCUMENTS

| | | |
|---|---|---|
| JP | 2001-196644 | 7/2001 |
| KR | 10-2010-0066416 | 6/2010 |

(Continued)

OTHER PUBLICATIONS

Zou, et al. "A Highly Hydrophilic and Biodegradable Novel Poly(annide-imide) for Biomedical Applications," Polymers 2016, 8:441.

(Continued)

*Primary Examiner* — Tu-Tu V Ho
(74) *Attorney, Agent, or Firm* — Fish & Richardson P.C.

(57) ABSTRACT

An organic light-emitting diode (OLED) structure includes a substrate, a dielectric layer on the substrate having an array of well structures with each well structure including a recess with side walls and a floor and the recesses are separated by plateaus having rounded top surfaces, a stack of OLED layers covering at least the floor of the well, and a light extraction layer (LEL) in the well over the stack of OLED layers.

8 Claims, 11 Drawing Sheets

(56) References Cited

U.S. PATENT DOCUMENTS

| | | |
|---|---|---|
| 2007/0217019 A1 | 9/2007 | Huang et al. |
| 2010/0013741 A1 | 1/2010 | Watanabe |
| 2010/0045575 A1 | 2/2010 | Kim |
| 2010/0110551 A1 | 5/2010 | Lamansky et al. |
| 2010/0117106 A1 | 5/2010 | Trottier |
| 2010/0124603 A1 | 5/2010 | Ito et al. |
| 2010/0295077 A1 | 12/2010 | Melman |
| 2013/0181235 A1 | 7/2013 | Kang et al. |
| 2015/0123086 A1 | 5/2015 | Lee et al. |
| 2016/0268554 A1 | 9/2016 | Wu et al. |
| 2017/0077448 A1* | 3/2017 | Sakamoto ............ H01L 51/5253 |
| 2017/0358779 A1 | 12/2017 | Wu et al. |
| 2018/0269414 A1 | 9/2018 | Bando |
| 2018/0358580 A1 | 12/2018 | Kim et al. |
| 2019/0058025 A1 | 2/2019 | Huang et al. |
| 2019/0103588 A1 | 4/2019 | Jiang et al. |
| 2019/0131567 A1 | 5/2019 | Li |
| 2019/0131568 A1 | 5/2019 | Li |
| 2019/0207155 A1 | 7/2019 | Lee |

FOREIGN PATENT DOCUMENTS

| | | |
|---|---|---|
| KR | 10-2011-0061317 | 6/2011 |
| KR | 10-1319306 | 10/2013 |
| KR | 10-2015-0052490 | 5/2015 |
| KR | 10-1900954 | 9/2018 |

OTHER PUBLICATIONS

PCT International Search Report and Written Opinion in International Appln. No. PCT/US2020/061475 dated Mar. 12, 2021, 10 pages.

\* cited by examiner

BPhen

BAlq

Alq

Tetracene

N,N'-diphenyl-N,N'-bis(3-methylphenyl)
(1,1'-biphenyl)-4,4'-diamine (TPD) (refractive index=1.7)

N,N'-bis(1-naphthyl)-N,N'-diphenyl-1,1'-biphenyl-4,4'-diamine (NPB)

N,N'-bis(1-phnathrene)-N,N'-diphenyl-1,1'-biphenyl-4,4'-diamine (PPD)

PPD is aslo known as: N,N'-Bis(phenanthren-9-y1)-N,N'-bis(phenyl)-benzidine,
PAPB, or as: N,N'-Di-[(9-phenanthrenyl)-N,N'-diphenyl]-1,1'-biphenyl-4,4'-diamine

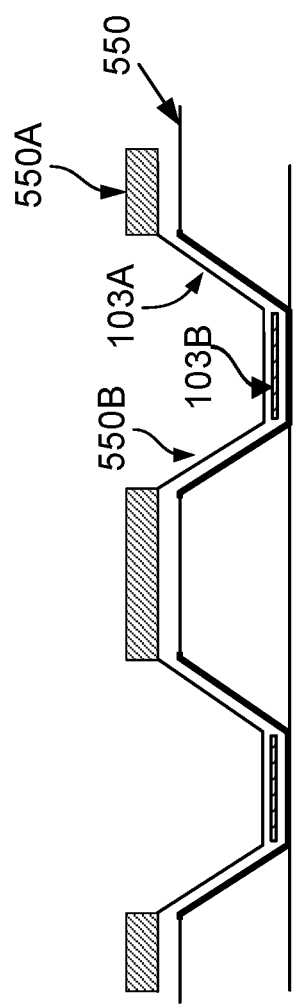
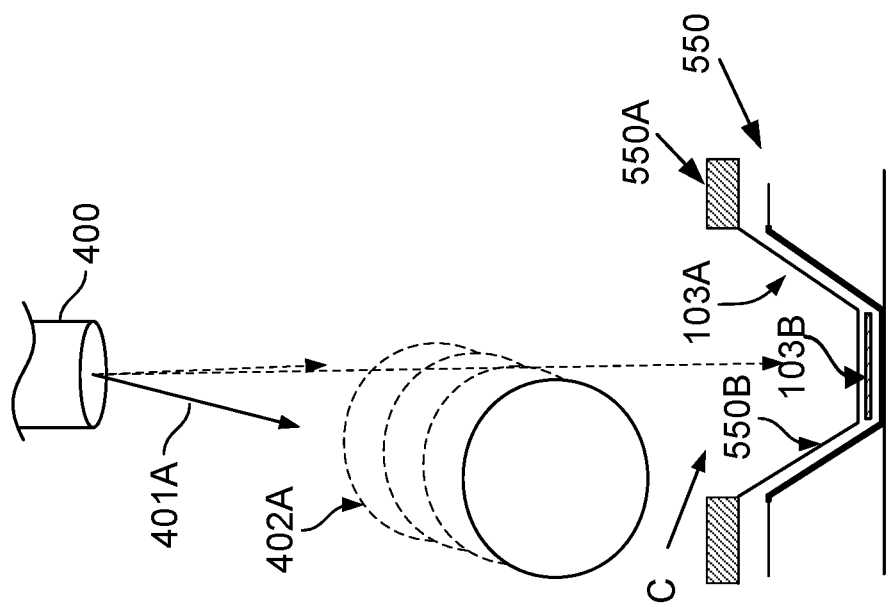
FIG. 6A
FIG. 6B

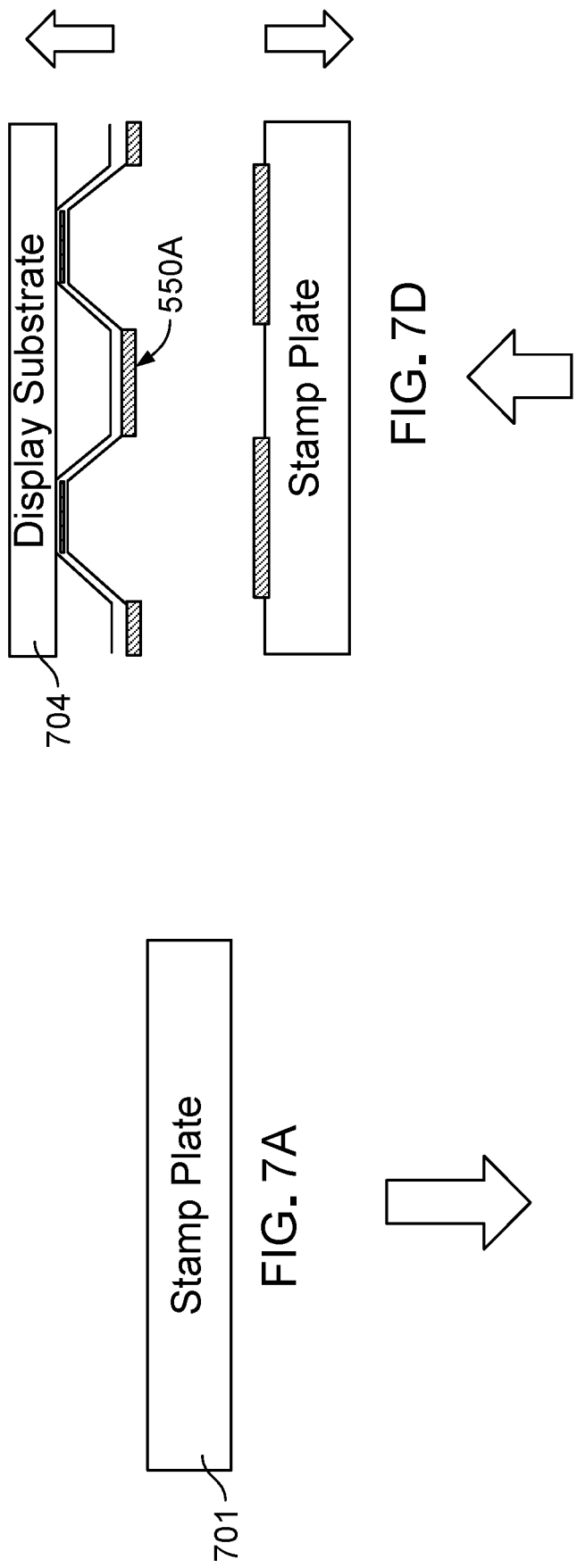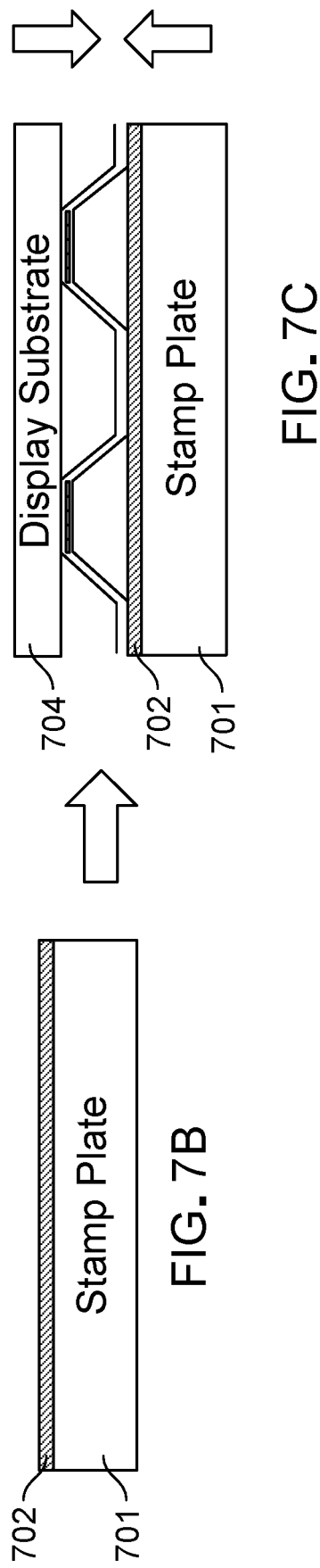

STRUCTURES AND METHODS OF OLED DISPLAY FABRICATION SUITED FOR DEPOSITION OF LIGHT ENHANCING LAYER

TECHNICAL FIELD

The present disclosure relates to fabrication of organic light-emitting diode (OLED) display devices.

BACKGROUND

An organic light-emitting diode (OLED or Organic LED), also known as an organic EL (organic electroluminescent) diode, is a light-emitting diode (LED) in which the emissive electroluminescent layer is a film of organic compound that emits light in response to an electric current. This organic layer is situated between two electrodes; typically, at least one of these electrodes is transparent. OLEDs are used to create digital displays in devices such as television screens, computer monitors, portable systems such as smartwatches, smartphones, handheld game consoles, PDAs, and laptops.

An OLED display can be driven with a passive-matrix (PMOLED) or active-matrix (AMOLED) control schemes. In the PMOLED scheme, each row (and line) in the display is controlled sequentially, one by one, whereas AMOLED control uses a thin-film transistor backplane to directly access and switch each individual pixel on or off, allowing for faster response, higher resolution, and larger display sizes.

AMOLED displays are attractive for high pixel density, superior image quality, and thin form factor in comparison to conventional LCD displays. AMOLED displays are self-emissive devices that can be made with thin film process, on thin and flexible substrates, and do not require backlights as used in LCD displays. In addition to superior power efficiency over LCD devices, AMOLED devices are noted for features such as "Consuming-Power-only-when-Lighting-Up," and "Consuming-only-the-needed-Power-Corresponding-to-the-Emitting-Intensity". AMOLED displays have thus been viewed as an attractive display technology for battery powered portable products.

SUMMARY

In one aspect, an organic light-emitting diode (OLED) structure includes a substrate, a dielectric layer on the substrate having an array of well structures with each well structure including a recess with side walls and a floor and the recesses are separated by plateaus having rounded top surfaces, a stack of OLED layers covering at least the floor of the well, and a light extraction layer (LEL) in the well over the stack of OLED layers.

Implementations may include one or more of the following features.

The plateaus may be rounded across an entirety of a width between side walls of adjacent well structures. The rounded top surfaces may have a radius of curvature sufficient for a droplet of material for the LEL layer to slide from the plateaus to the recess.

The plateaus may include a flat section and rounded corners between the flat section and the side wall of the well. The rounded top surfaces may have a radius of curvature sufficient for a droplet of material for the LEL layer to slide from the plateaus to the recess. A peak of the rounded top surface of the rounded plateaus may be about 5 to 50% higher than the depth of the well. The rounded corners may have a radius of curvature sufficient for a droplet of material for the LEL layer to slide from the plateaus to the recess.

The OLED structure may include a UV-blocking layer disposed between the stack of OLED layers and the light extraction layer. The UV-blocking layer may extend over the rounded top surfaces of the plateaus.

In another aspect, a method for manufacturing an organic light-emitting diode (OLED) structure includes depositing a light extraction layer (LEL) over a stack of OLED layers by directing fluid droplets of a LEL precursor to an array of well structures separated by plateau areas, each well structure including a recess with sidewalls and a floor, and wherein the plateau areas have rounded top surfaces such that the droplets of the LEL precursor are guided into recesses of the well structures, and curing the droplets of the LEL precursor to solidify the LEL in the recess.

Implementations may include one or more of the following features.

The method may further include after depositing the LEL precursor, using an air blade to break connections of the LEL precursor between adjacent well structures. The method may further include delivering a layer of a fluid precursor of a light extraction layer (LEL) over a stack of OLED layers that are formed on an array of wells separated by plateau areas so at least partially the wells, scanning the air blade across the stack of OLED layers to break connections of the fluid precursor between adjacent wells, and curing the fluid precursor to form solidified LEL material in the wells.

The method may further include forming the dielectric layer on the substrate, forming recesses in the dielectric layer to provide the array of well structures, and depositing the stack of OLED layers over the dielectric layer and into the array of well structures. Forming the recesses may include depositing and patterning a photoresist layer, reflowing the photoresist layer, and etching to form the recesses in the dielectric layer and to round the top surface of the plateaus. The dielectric layer may include a photoresist layer. Reflowing the photoresist layer may include raising a temperature of the dielectric layer sufficiently close to a glass transition temperature or melting temperature of the photoresist layer to cause reflowing. Before depositing the LEL layer, the method may include depositing a UV blocking layer, and wherein curing the curing the droplets of LEL precursor may include UV-curing. Directing fluid droplets of LEL precursor may include droplet ejection printing from a nozzle of a printhead that scans laterally across the array of well structures In another aspect, a method for manufacturing an organic light-emitting diode (OLED) structure includes depositing a light extraction layer (LEL) over a stack of OLED layers by directing fluid droplets of a LEL precursor to an array of well structures separated by plateau areas, each well structure including a recess with sidewalls and a floor, and using an air blade to break connections of the LEL precursor between adjacent well structures on the plateau areas, and curing the LEL precursor to form solidified LEL material in the wells.

Implementations may include one or more of the following features.

The air blade may break connections and the LEL precursor may accumulates over the well to form a convex top surface over the well. The air blade may break connections and the LEL precursor that accumulates may have a generally planar top surface in the well.

Advantages may include, but are not limited to, one or more of the following.

In an OLED device one or more layers, e.g., a light extraction layer (LEL), may be fabricated using UV-curable inks. This permits the use of droplet ejection techniques that use UV-curing to deposit the layer(s), which in turn can permit manufacturing at higher throughput and/or lower cost. Droplets can be guided into the wells by features on the OLED structures, permitting the droplet ejection to be performed with lower required accuracy and thus using less expensive printing machinery.

The details of one or more aspects of the subject matter described in this specification are set forth in the accompanying drawings and the description below. Other features, aspects, and advantages will become apparent from the description, the drawings, and the claims.

BRIEF DESCRIPTION OF THE DRAWINGS

FIGS. 6A to 6B show yet another example of filling OLED structures with UV-curable ink droplets in a self-aligned manner.

FIGS. 7A to 7D illustrate one example of forming the top surface between the neighboring wells.

Like reference symbols in the various drawings indicate like elements.

DETAILED DESCRIPTION

An OLED is a two-terminal thin film device with a stack of organic layers including a light emitting organic layer sandwiched between two electrodes. At least one of the electrodes is transparent, thus allowing the emitted light to pass through. Typically, an encapsulation or passivation covers the OLED stack. Due to mismatch of optic parameters in the OLED stack and the encapsulation or passivation layer thereon, significant efficiency loss can occur. In addition, in a conventional device configuration with a stack of planar layers, significant light can be absorbed by the support substrate or escape at low angles.

An internal quantum efficiency (IQE) quantifies the ratio of the number of converted photons and the number of input electrons whereas the external quantum efficiency (EQE) indicates the ratio of number of emitted and extracted photons that have been converted from the number of input electrons. In this context, even though IQE can be almost perfect, EQE can be far from ideal because significant amount of emitting light can be trapped inside the OLED display or waveguided along horizontal direction (in parallel to the substrate). In one example, even with ideal IQE (e.g., about 100% for phosphorescent materials), an EQE of about 20 to 25% has been realized in commercial OLED with conventional device configurations. In addition to optical energy loss to output emission, the light trapped inside can also be waveguided to neighbor pixels and can be scattered into front view, causing "light leakage" or "optical crosstalk", and reducing display sharpness and contrast.

Figure 1A:
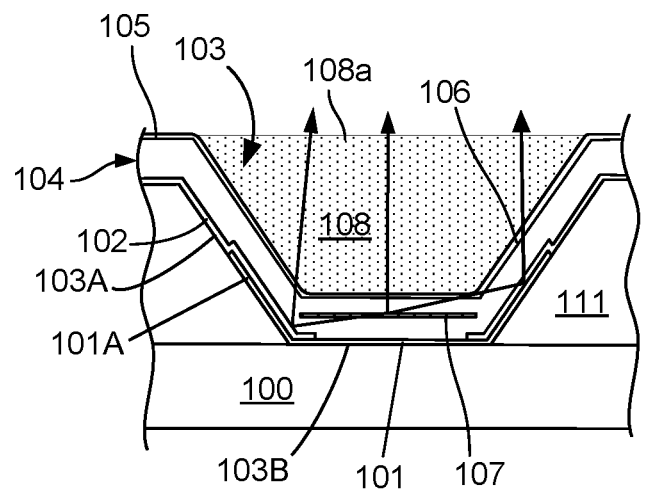
FIGS. 1A to 1B show examples of cross-sectional views of a top emission OLED pixel with a patterned/structured light extraction layer of index matching material.
Figure 1B:
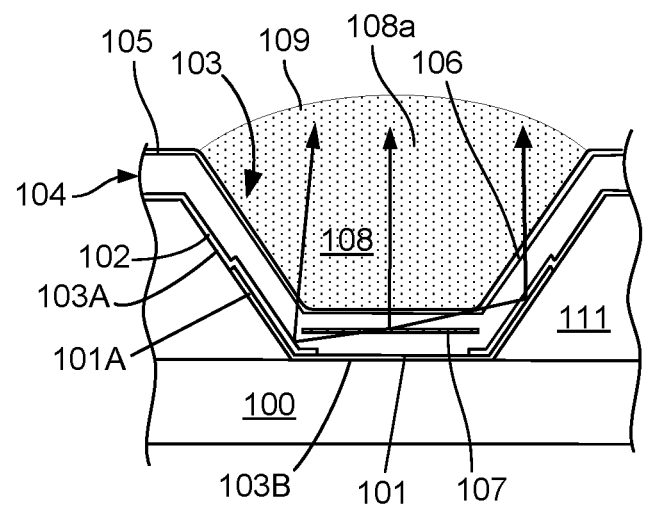
Figure 1C:
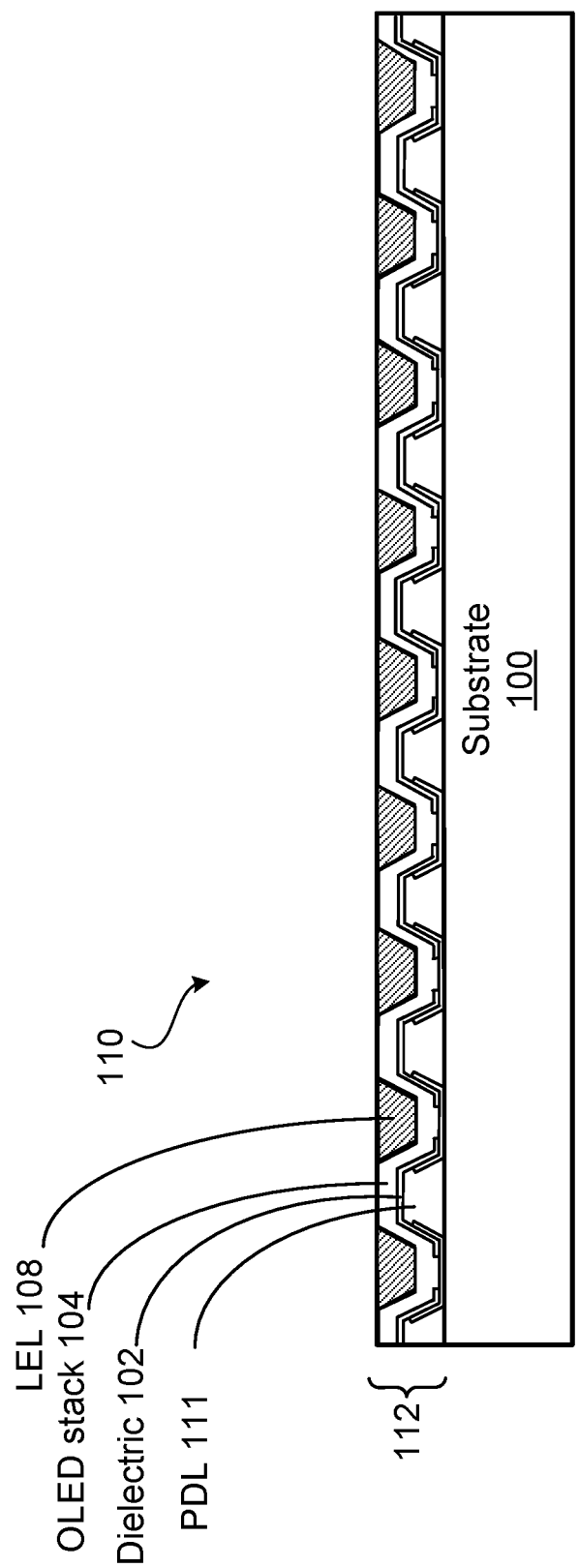
FIG. 1C shows an example of a cross-sectional view of an array of top emission OLED pixels with the patterned/structured light extraction layer of index matching material.

Referring to FIGS. 1A to 1C, one solution to this problem is to form the OLED stack in a well structure 103, with mirrors along the bottom 103B and portions of the oblique sidewalls 103A of the well and a patterned light extraction layer 108 filling the well. Examples of a top-emitting OLED structure are shown in FIGS. 1A and 1B. The OLED structure is formed on a support substrate 100, which optionally can be removed following the fabrication process.

The well can be provided by a recess in a dielectric pixel defining layer (PDL) 111 that is disposed over the support substrate 100. The pixel defining layer (PDL) 111 can be formed after a pixel driving circuit made with one or more thin film transistors (TFTs) is formed on the substrate 100. The PDL 111 can be a polymeric material, e.g., can be formed by depositing a layer of photoresist material. The layer of polymeric material is then selectively patterned to form recesses that will provide the wells. The top surface PDL provides a plateau that separates the individual OLED subpixels within the devices.

A conductive anode 101 is formed at the bottom 103B of or below the well structure 103. The anode 101 can extend up a portion of the oblique side walls 103A of the well. The anode 101 can be silver and/or another reflective conductive material or can be from a conductive non-reflective material that is coated with a conductive optically reflective material. In some implementations, the anode 101 is sufficiently reflective to serve as a mirror.

The anode 101 can be processed before the PDL 111 and formed after a thin film transistor (TFT) is formed on substrate 100. For example, the thin film transistor can include conductive terminals for the gate, drain and source regions of the transistor. Here, the anode 101 can be disposed over the TFT and arranged in electrical contact with the drain of the TFT by, for example, conductive vias through a dielectric layer.

As illustrated in FIGS. 1A and 1B, the anode 101 can be formed after the pixel defining layer (PDL) 111 is deposited and patterned. A portion 101A of the anode 101 can extend partially or fully up the oblique sidewalls 103A into the region of the PDL slope. However, the anode 101 stops short of the top of the recess (i.e., the top of the plateau). As a result, the mirror provided by the anode 101 can extend partially or fully up the oblique sidewalls 103A.

Alternatively, the anode 101 can be deposited before the PDL 111. A portion of the anode 101 can extend below the pixel defining layer (PDL) 111. For example, the anode 101 can be deposited only in the area of the flat bottom region 103B. In this case, a separate mirror layer can be formed that covers the bottom 103B of the well and extends partially or fully up the oblique sidewalls 103A.

Assuming the anode 101 is formed over the PDL 111, a transparent dielectric layer 102 can be formed over a portion of the anode 101 and over exposed portions of the PDL 111. The aperture in the dielectric layer 102 will define an emission area for the OLED. The dielectric layer 102 can be formed using photoresist type of material. As illustrated, the dielectric layer 102 can cover the anode 101 at the outer edge of the bottom 103B of the well and on the oblique sidewalls 103A. But otherwise, extension of the dielectric layer 102 into the bottom 103B of the well is generally minimized.

An OLED layer stack 104 that includes a light emission zone 107 is formed over the anode 101. The OLED layer stack 104, for example, in a top emitting OLED stack, can include an electron injection layer (EIL), an electron transport layer, a hole blocking layer, a light emissive layer (EML), an electron blocking layer (EBL), a hole transport layer (HTL), and a hole injection layer (HIL), although this is just one possible set of layers. The lowest layer of the OLED stack 104 is in electrical contact with the anode 101, either directly or through a conductive mirror layer disposed on the anode. The portion of the light emissive layer (EML) above the region of the anode 101 exposed through the aperture in the dielectric layer 102 can provide the light emission zone 107.

Another transparent electrode 106, e.g., the cathode, can be formed over the OLED stack 104. The top layer of the OLED stack 104 is in electrical contact with the cathode 106.

A capping layer (CPL) can be placed on top of the cathode 106. CPLs are typically organic materials similar to non-EML OLED layers. A passivation layer can be deposited on the CPL layer.

The electrode 106 can be a continuous layer covering the entire display and connecting to all pixels. In comparison, the anode 101 is not made continuous so that independent control of each OLED can be achieved. This permits sub-pixel control; each pixel can include three subpixels of different colors, e.g., R, G, and B.

In implementations in which the anode 101 serves as sidewall mirrors (e.g., deposited along the slopes of the PDL), the emission area can be further controlled by placing the dielectric layer 102 over such sidewall mirrors. The extent of the dielectric layer 102 can be varied. In general, OLED emission is highly dependent on layer thicknesses. The dielectric layer 102 allows suppression of emission from the OLED structure formed on the sidewalls (during device fabrication) where the thickness differences between sidewall and bottom of the well can result in inconsistent emission characteristics, including emission spectra and color coordinates.

The OLED structure further has an index-matching filling material 108 disposed inside the concave area of well structure 103. The top surface 108a of the index-matching filling material/layer can be flat (see FIG. 1A) or curved/non-planar (see FIG. 1B). Through a proper device design, by introducing the mirror around the OLED emission zone and the light extraction layer (through index-matching material in the concavity), EQE can be improved by a factor of 2-3 from the conventional OLED design. As a result, the power consumption of an OLED display in portable applications can be reduced by a commensurate factor of 2 to 3, which allows using a smaller, lighter weight rechargeable battery and achieves faster charging time than that used in the current mobile devices such as touch-screen phones, pads, and laptops. In a similar vein, the same mobile device with high efficient OLED display can run a much longer time (for example, slightly less than a factor of 2-3) on a single charge of the original battery. Another benefit of such highly efficient pixel architecture is longer lifetime of the devices as the pixels will achieve desired brightness with lower current and voltage, which leads to lower degradation phenomena. Yet another benefit is the technical feasibility of achieving higher pixel density as the higher EQE enables smaller emitting area to achieve the same brightness as before.

However, the newly added light extraction layer (LEL) may not be manufacturable at a commercially viable price using conventional techniques. This added layer calls for additional processes and corresponding tools. In particular, it would be desirable to deposit the filler layer using droplet ejection techniques, e.g., a 3D printing techniques using droplet ejection. The liquid material to be ejected as droplets is often called an "ink", although it need not (and typically would not) include pigmentation.

One type of filling "ink" promising for the LEL is a solution including organo-metallic molecules or metal-oxide nano-particles with or without surface passivated with organic linking units (named "MO ink" in more detail below). This type of filling ink has high solid loading (e.g., high percentage ratio of forming solid/ink volume which may be in slurry mixture) and tunable dielectric constant to potentially maximize the output emission. The curing method involves exposing the filling inks to UV radiation along with a duration of post annealing time at an elevated temperature. Unfortunately, UV exposure dose required for curing of the LEL precursor material can be harmful to the OLED structure underneath.

To address the manufacturing challenge caused by the UV-curing ink for the index matching material of the light extracting layer (LEL), the present disclosure proposes solutions that introduces a UV-blocking layer underneath the LEL layer so that UV-curable inks can be adopted for the patterned LEL layer without compromising the performance of the OLED stack underneath. Both organic and inorganic materials can be used for the UV-blocking layer.

Figure 4B:
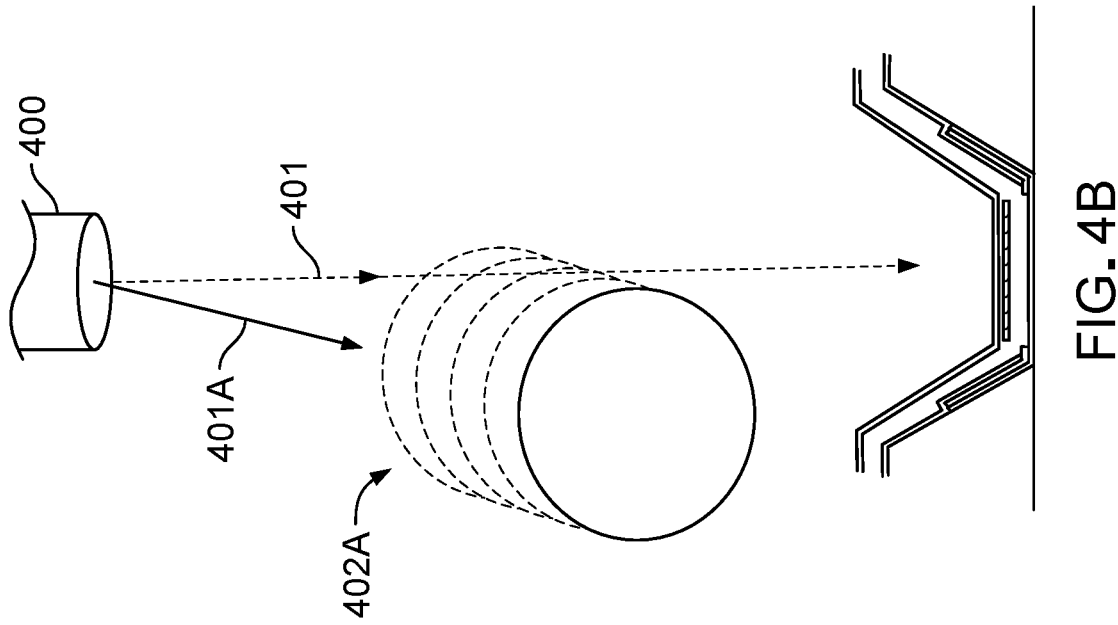
FIGS. 4A to 4B show examples of filling OLED structures with UV-curable ink droplets.

In addition, an appropriate surface profile or a hydrophobic surface can be provided that enables mis-aligned ink droplets during manufacturing to fall back into the well by means of gravity and the surface property of the top of the dome (as discussed in further detail in FIG. 4B below). These techniques can be used in conjunction with or independent of the UV-blocking layer deposited over the OLED stack (as discussed in further detail in FIG. 2 below).

Moreover, with the inkjet process of the present disclosure, a patterned LEL layer can be formed with a gradient in the index of refraction. The inkjet printing or slot-die coating with multiple coating steps enables the patterned LEL with gradient index and with integration with the covering glass (or touch panel in on-cell touch configuration).

FIG. 1C shows the cross-sectional view of an array 110 of OLED pixels arranged in a layered structure 112 on substrate 100.

Figure 2:
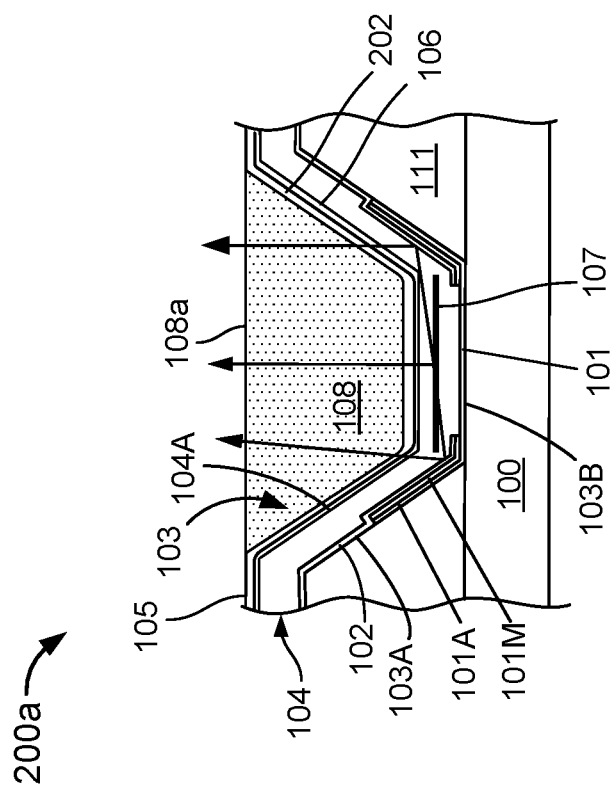
FIG. 2 shows an example of a cross-sectional view of a top emission OLED pixel with an UV-Blocking layer underneath the patterned/structured light extraction layer.
Figure 3D:
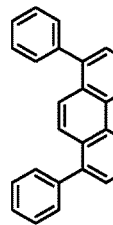
FIGS. 3A-3G show examples of organic materials suitable for the UV-blocking layer.
Figure 3E:
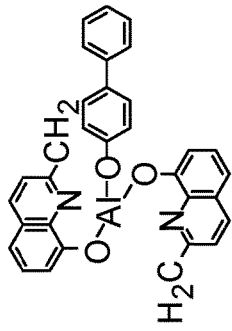
Figure 3F:
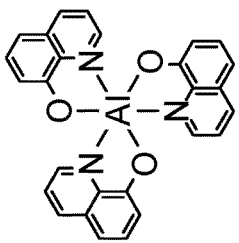
Figure 3G:
Figure 3A:
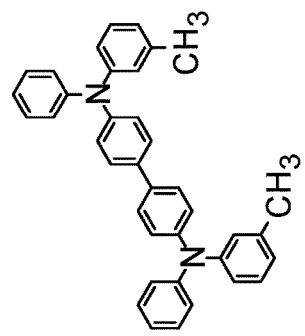
Figure 3B:
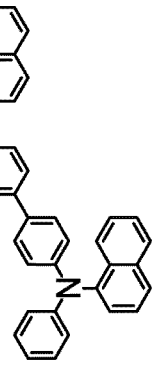
Figure 3C:
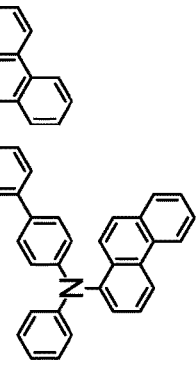

Further referring to FIG. 2, a cross-section view of an OLED structure 200A illustrates an UV-blocking layer 202 between the top-surface 104A of the OLED layer 104 and the patterned LEL layer 108. Except as discussed below, the OLED structure 200A can be similar to the OLED structure 100A and 100B discussed with reference to FIGS. 1A and 1B. The OLED structure 200A is formed on a substrate 100 and includes an array of well structures 103, each including the bottom region 103B and sidewall region 103A. The well structures 103 are separated by the plateau 105. The floor of each well structure 103 is a bottom flat surface above substrate 100, which represents the flat top metal surface formed during thin film transistor (TFT) circuit process (such as the metal layer used for source and drain electrode of a thin film transistor TFT). As discussed above, the dielectric layer 102 is formed on the slopes of the PDL 111 and extends to the edge area of the bottom region 103B, although extension into the recess bottom region is possible but generally minimized.

The anode 101 is formed in the bottom region 103B and can extend partially up the sidewalls 103A. As noted above, the anode 101 can be reflective, or can be a conductive non-reflective material that is coated with a conductive optically reflective material. Alternatively or additionally, the anode can be a transparent conductive material deposited over a conductive or non-conductive reflective layer. For example, the anode 101 can include conductive indium tin oxide (ITO) deposited on top of a reflective mirror layer. The anode 101 may also include metals of lower cost and/or higher conductivity (such as Al).

A mirror layer 101M can be formed on anode 101, e.g., over the sidewall portion 101A of the anode 101. Alternatively, if the anode 101 is formed below the PDL 111, then the mirror layer 101M can be formed on the PDL 111, e.g., over the sidewall portion 103A of the well. However, if the anode is formed of a highly reflective conductive material, e.g., silver (Ag), then the mirror layer may not be needed. For an anode of an OLED, internal total reflection is desired.

In some implementations, the anode is limited to the bottom region 103B. In some implementations, the anode also extends partially or fully up the sloped sidewalls 103A of the recess. In some implementations, the mirror layer 101M is a conductive reflective metal that extends onto the sloped sidewalls 103A of the recess. This conductive reflective metal, which is formed on top of the initial anode, can lead to a potential new anode on the bottom/floor region of the pixel. As discussed above, a transparent dielectric layer 102 can be deposited and patterned to eliminate electrical excitation and light emission from the sidewall region 103A.

The cathode 106 can be a continuous layer that is unpatterned and transparent. In a top emitting configuration, the light extraction layer (LEL) 108 is on top of the UV-blocking layer 202, which, in turn, is on top of the cathode 106. In this configuration, a passivation layer can be deposited on the capping layer (CPL) layer which is right above the cathode 106.

As illustrated in, for example, FIGS. 1A to 1C, the LEL layer 108 is disposed over the OLED stack 104 and top cathode 106. The LEL layer 108 at least partially fills each well. In some implementations, the LEL layer 108A "overfills" the well so as to form a convex top surface 109 that projects above the top surface of the plateaus 105.

Between the top surface 104A the OLED layer stack 104 and the patterned LEL 108 is a UV-blocking layer 202. The UV-blocking layer 202 can be formed with a similar process used for forming an OLED layer (such as physical vapor deposition), or by a different process (such as chemical vapor deposition). The UV blocking layer 202 can also be formed by a coating method, e.g., spin-coating. The UV blocking layer 202 has strong absorption at the UV wavelength used for processing the LEL layer 108/108a (e.g., at least 90% to 100% absorption). The UV-blocking layer 202 can be relatively thin, e.g., 50 to 500 nm thick. Examples of materials for the UV blocking layer 202 can be found below. The desired process for depositing the UV blocking layer may depend on the material chosen. In general, an evaporative process can be advantageous because sputtering or chemical vapor deposition (CVD) may lead to additional device damaging elements (for example, plasma in sputtering, contaminants and possibly plasma in CVD/PECVD).

Although a passivation layer can be deposited on the CPL layer, in some implementations the UV blocking layer also functions as the passivation layer and a separate passivation layer on the CPL layer is not required. In this case, the UV blocking layer can function as permeation blocking layer for the potential wet LEL deposition, like ink jet printing (IJP).

Both organic and inorganic materials can be used for the UV-blocking layer. Example of organic materials that can be used for UV-blocking layer include: N,N'-Bis(3-methylphenyl)-N,N'-diphenylbenzidine, TPD (3.18 eV); N,N'-Di(1-naphthyl)-N,N'-diphenyl-(1,1'-biphenyl)-4,4'-diamine, NPB (3.0 eV); N,N'-Bis(phenanthren-9-yl)-N,N'-bis(phenyl)-benzidine, PAPB (or PPD); 4,7-Diphenyl-1,10-phenanthroline, BPhen (3.0 eV); Bis(8-hydroxy-2-methylquinoline)-(4-phenylphenoxy)aluminum, BAlq (3.0 eV), Tris-(8-hydroxyquinoline)aluminum, Alq (2.8 eV); Tetracene, C8H12 (3.0 eV); 4-phenyl, 4P (3.1 eV); 6-phenyl, 6P (3.1 eV), and the like (number in the bracket representing absorption edge). The molecular structures of these structures are shown in FIG. 3.

This type of organic materials is often known as charge transport molecules (either hole transport or electron transport) in the field of organic thin film devices such as organic light emitting diodes. The energy gap can be tuned to desired wavelength by molecular structure engineering while maintain the processability (for example, by thermal deposition) of the material. Example includes TPD, NPB, and PAPB (or PPD). By replacing -methylphenyl group with -naphthyl group or -phnathrene group, the onset of the absorption band can be effectively tuned. In addition to tuning the phenyl group, bandgap engineering can also be achieved by replacing the —H atom on benzene ring with —OH or —CN group. Another characteristic of this type of organic materials is the high absorption coefficients. For example, absorption coefficients over $10^5$ cm$^{-1}$ are often seen in this type of molecules due to its direct type of energy gap between UV absorption bands. At this absorption level, UV radiation intensity can be attenuated by 10 times with a UV-blocking layer of 100 nm thickness and by 100 times with a UV-blocking film of 200 nm in thickness. These materials are thus excellent candidates for the UV-blocking layer (202) underneath the LEL (105/105a). When selecting the composition with multiple sub-groups comprising different number of phenyl rings (for example, NPB), broad-absorption can be achieved over entire UV radiation from a Hg lamp (from UV-I to UV-III bands). Since the organic material used for the UV blocking layer can also be used for the charge transport layer in the OLED stack, the same deposition tool can be used.

The UV blocking layer can also be formed with another type of organic molecules known as engineering polymers. Examples include, but are not limited, polystyrenes, polycarbonates, PMMA and their derivatives. This type of engineering polymers have absorption edge close to 3.1 eV and block UV light effectively.

Examples of inorganic material suitable for the UV-blocking layer 202 include $MoO_3$, $MnO_2$, NiO, $WO_3$, ZnO, AlZnO, and alloy oxides comprising these materials. These films can be fabricated with thermal or other type of physical deposition method without damaging the OLED device underneath.

Combination of the materials as discussed above in multiple layer stack or in blend form can also be used for the UV-absorption layer 202. The thickness of the UV-blocking layer can be chosen in range of 50-500 nm, depending on the absorption coefficient of the UV-blocking layer and the attenuation level for the UV-dose needed for the LEL ink curing.

Metal-oxide and/or organometallic compound based LEL layer 105/105a can be formed with inks with corresponding organometallic precursors, examples of such inks include ZrO, ZrOC, AlO, AlOC, TiO, TiOC, ZnO, ZnOC, and the combination in blend form (denoted as MO/MOC inks in the following text). Such compounds are characterized with refractive index higher than that of the organic layers in OLED stack. Keeping certain amount of carbon atoms in the forming LEL (i.e., the metal-OC compounds above) may achieve the index matching between the LEL and OLED stack. As a reference point, metal oxide such as ZrO or TiO2 can have refraction index substantially higher than a target value (for example, n=1.82). With the amount of carbon (C), the n can be tuned within a range from approximately 2.2 down to approximately 1.8.

The solid loading of the metal-oxide nano-particles are typically in range of 20-80% (e.g., percentage ratio of forming solid/ink volume). Alcohols such as isopropanol alcohol (IPA) and glycol ethers such as propylene glycol methyl ether acetate (PGMEA) can be used as the solvents for this type of MO/MOC inks. To reduce the damage to the OLED underneath, $H_2O$ molecules can be removed from the solvent during the ink preparation. Printing the ink under low humidity (such as under dry air, N2 or Ar) or with a moderate substrate temperature in 40-60° C. range may also be used to minimize performance reduction of the OLED underneath. In one illustration, using a 1-10 pl nozzle head, a drop volume may be achieved for the emitting pixels for portable display products (~25 um×25 um×2 um~$10^{-15}$ $m^3$~$10^{-12}$ l=1 pl). Larger nozzle head can be used for desk-top and wall-hanging displays with larger pixel pitches. The desirable solid content can be achieved with smaller nozzle head with multiple ink drops at each stop, or with a large nozzle head with single drop for each well. Nozzle array is often used to improve the throughput to achieve ~1 minute/substrate tact time for mass-production.

For example, an LEL forming process over the UV-blocking layer includes a printing process, a solvent removal and pre-dry process under a moderate temperature (50-100° C.) for a brief time (a few minutes). Pre-baking in a chamber under controlled environment and with reduced pressure can reduce the process time. The dried LEL array can then undergo an UV exposure for crosslink with dose in ~0.1-10 $J/cm^2$. A final setting process is carried out at elevated temperature (for example, in 70-130° C. for 5-30 minutes).

In a 3D printing process, the LEL layer 108 can be formed by successively depositing and curing multiple sublayers, with the stack of sublayers providing the LEL layer 108. A sublayer can correspond to a single scan of a printhead and curing of the ejected droplets from the printhead. In some implementations, for each well, a sublayer of the LEL can be formed with multiple drops of the ink. Alternatively, each sublayer within the LEL layer 108 for a given well can be formed with a single drop per sublayer; due to surface tension the drop can spread out to cover the width of the well. In some implementations, the well is filled with the liquid precursor for the LEL and the entire well is cured at once, rather than sublayer by sublayer.

Figure 4A:
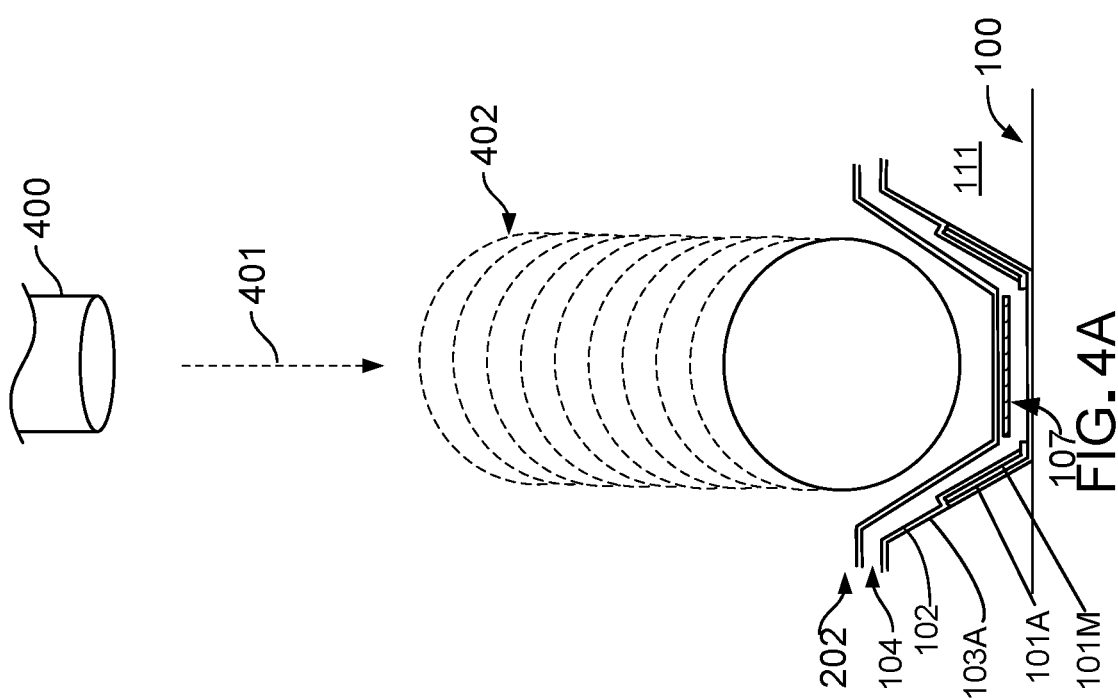

In one example, an ink jet printing process can be used for each emitting pixel. The cross-section view of an example 3-D structure is shown in FIG. 4A below. As illustrated, ink droplets 402 are delivered from nozzle head 400 in direction 401 into the well structure 103. The ink drops may include filler material having an optical index of, for example, about 1.8 that substantially matches that of the OLED stack. Such filler material can also have an optical index higher than that of the OLED stack.

With inkjet process of the present disclosure, a patterned LEL layer can be formed with a gradient from top to bottom in the index of refraction. In particular, the inkjet printing or slot-die coating with multiple coating steps enables the patterned LEL with gradient index and with integration with the covering glass (or touch panel in on-cell touch configuration). The drops in the consecutive scans can use inks with a consecutively lower refraction index than the previous scan (by increasing the C/O ratio, or by changing MO composition with multiple metals with different refraction index). The wetting effect of the dropping ink on the receiving MO/MOC film can be used for further tuning the gradient profile. Eventually a patterned LEL array can be formed with the refraction index matching to that of the OLED stack (with refraction index of ~1.75-1.82), and the index of the LEL top surface with an index matching to a protection glass (such as, for example, the Gorilla glass, a Corning brand, used in many mobile phones with refraction index ~1.52). For example, the cross-section profile of the gradient index can be controlled by ink properties, and by the detail printing conditions. Thus, with a dedicated design, the desired view angle dependencies can be achieved for different applications. For example, larger view angle is preferred for monitors and wall-hanging large size TVs. Narrow view angle is preferred for entertaining displays in commercial airplanes. Moderate view angle with strong emission intensity in front view direction is preferred for palm size mobile phones of which the optimized front view performance allows longer operation time per battery charging.

However, ink droplets 402A may be fired from nozzle head 400 in direction 401A that is mis-aligned such that the ink droplets 402A fail to reach the bottom of well structure 103.

Figure 5B:
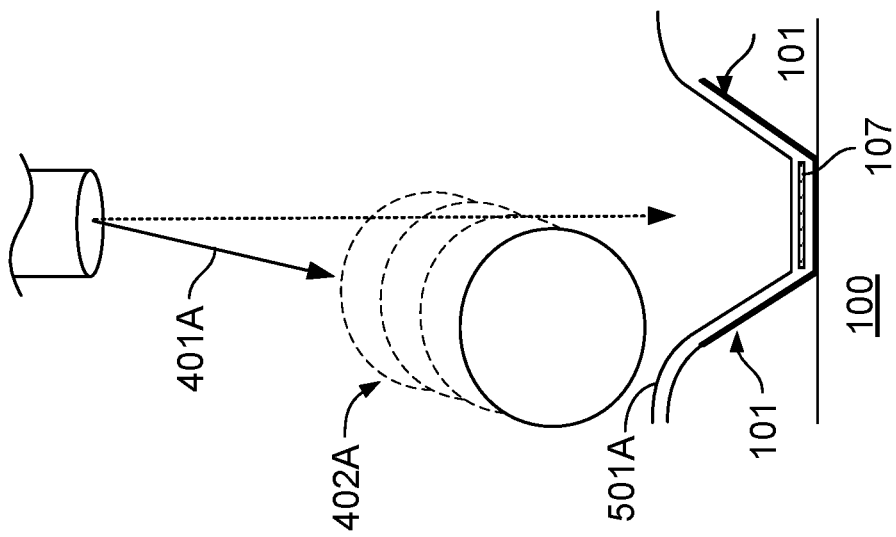
FIGS. 5A to 5B show an additional example of filling OLED structures with UV-curable ink droplets.
Figure 5A:
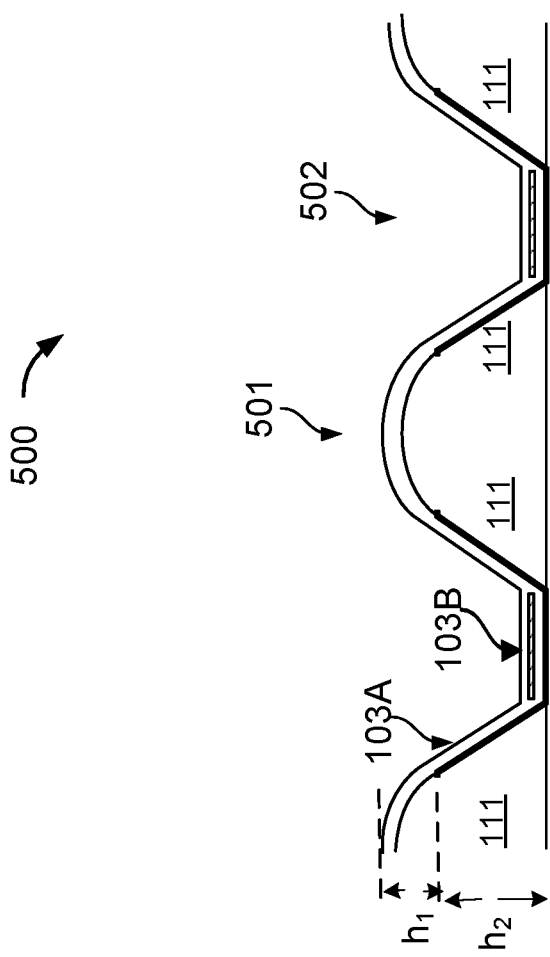

Various techniques can be used to help guide the ejected droplets into the wells over the OLED structure. For example, referring to FIGS. 5A to 5B, an OLED array structure 500 can be constructed with a flat bottom 103B and tilted side walls 103A in each well 502. However, the plateaus 105 between the wells have a convex top surface 501. For example, the plateaus can form a rounded (such as a dome) surface 501 between adjacent wells. The PDL plateaus (111) between pixels can be flat in some cases. In other cases, the sidewalls form a slope that exhibits a decreasing angle with respect to the substrate as the sidewalls progress from the bottom of the well to the top of the well. As illustrated, the rounded top surface has a peak of $h_1$, measured from a transition region on the sidewall to the epitome of the dome. The transition is between the flat side wall and rounded plateaus. The depth of the well, as measured from the bottom of the well to the transition region, is illustrated as $h_2$. In this example, $h_2$ can be 5 to 50% of $h_1$. Here, the curved region PDL with rounded tops can be formed after baking the PDL at a temperature close to its glass transition temperature or melting temperature. The sloped sidewalls are also formed during this baking process, e.g., by reflow of the PDL material. When ink printing is performed from a nozzle head 400, ink droplets can be ejected in direction 401 for delivery toward each well 502. For those droplets in a slightly mis-aligned direction 402A, these droplets may follow a tilted trajectory 501A. However, when these mis-aligned droplets impact the rounded surface 501, the droplets can roll off the plateau area 105, e.g., under the influence of gravity, and into the correct well 502. The droplets may also break off at the plateau area 105 and then fall into the well 502.

FIGS. 6A to 6B show another example for self-aligning the filler into the wells. FIG. 6A shows cross-section view of the OLED structure 600 with top region 550 between neighbor wells arranged with a coating 550A so that the top surface 550 of the plateau 105 is more hydrophobic to the ink droplet than the bottom and the tilted side walls 550B in the well. For example, the top surface of the plateaus can be covered by a coating that is more hydrophobic than a top surface of the UV blocking layer (or than a top surface of the OLED structure if the UV blocking layer is not used). Alternatively, the bottom 103B and tilted side walls 103A can be coated with a coating that is more hydrophilic than the top surface 550 of the plateaus 105. In either case, the bottom and side walls of the well are more wetting to the ink droplet than the top surface 550.

Hydrophobic molecules tend to be nonpolar and, thus, prefer other neutral molecules and nonpolar solvents. Because water molecules are polar, hydrophobes do not dissolve well among them. Hydrophobic molecules in water often cluster together, forming micelles. Water on hydrophobic surfaces will exhibit a high contact angle rather than spreading out. By virtue of the different coatings for top region 550A and tilted side walls 550B and the bottom, ink droplets from a nozzle head can be induced to move (see arrow C in FIG. 6B) in into the well region. A treated top surface 550A with different surface property thus allows the improperly aimed ink droplets to roll back into the well and preserves high process yield.

To add the coating 550A as illustrated in FIGS. 6A to 6B, various approaches can be used. FIGS. 7A to 7D illustrate one example of forming the top surface between neighbor wells by stamping transfer. In FIGS. 7A to 7B, a hydrophobic layer 702 is formed on stamp plate 701. Thereafter, the loaded stamp plate is brought in surface contact with a display substrate 704 on which an array of well structures has been formed, as shown in FIG. 7C. The stamp plate 701 and the display substrate 704 are then brought apart. The hydrophobic layer 702 remains on the portions of the surface that were brought into contact, so that the hydrophobic material coating 550A for top surface 550 is formed between neighboring wells, as illustrated in FIG. 7D.

Figure 8A:
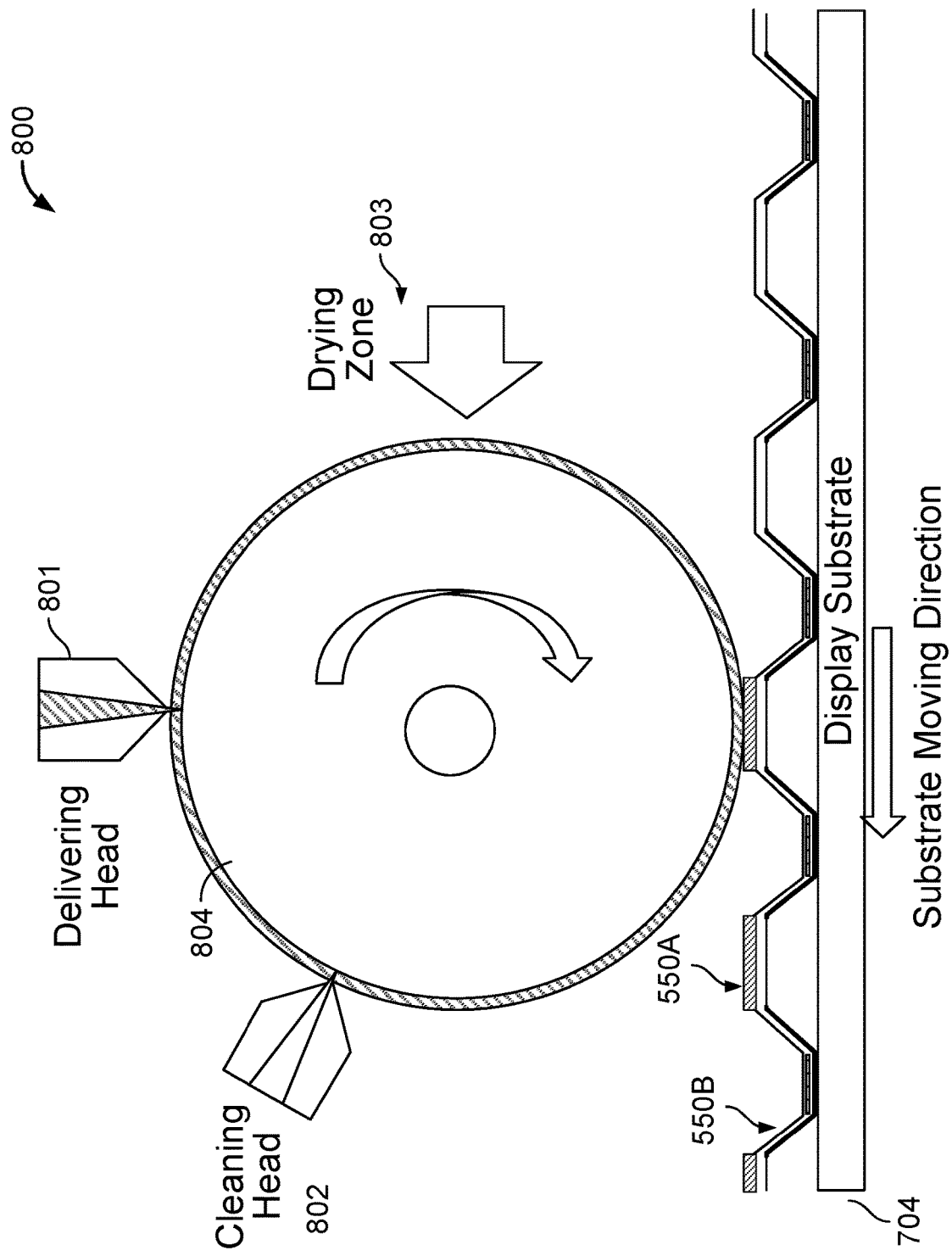
FIG. 8A to 8B show examples of forming the top surface between neighbor wells by drum printing.
Figure 8B:
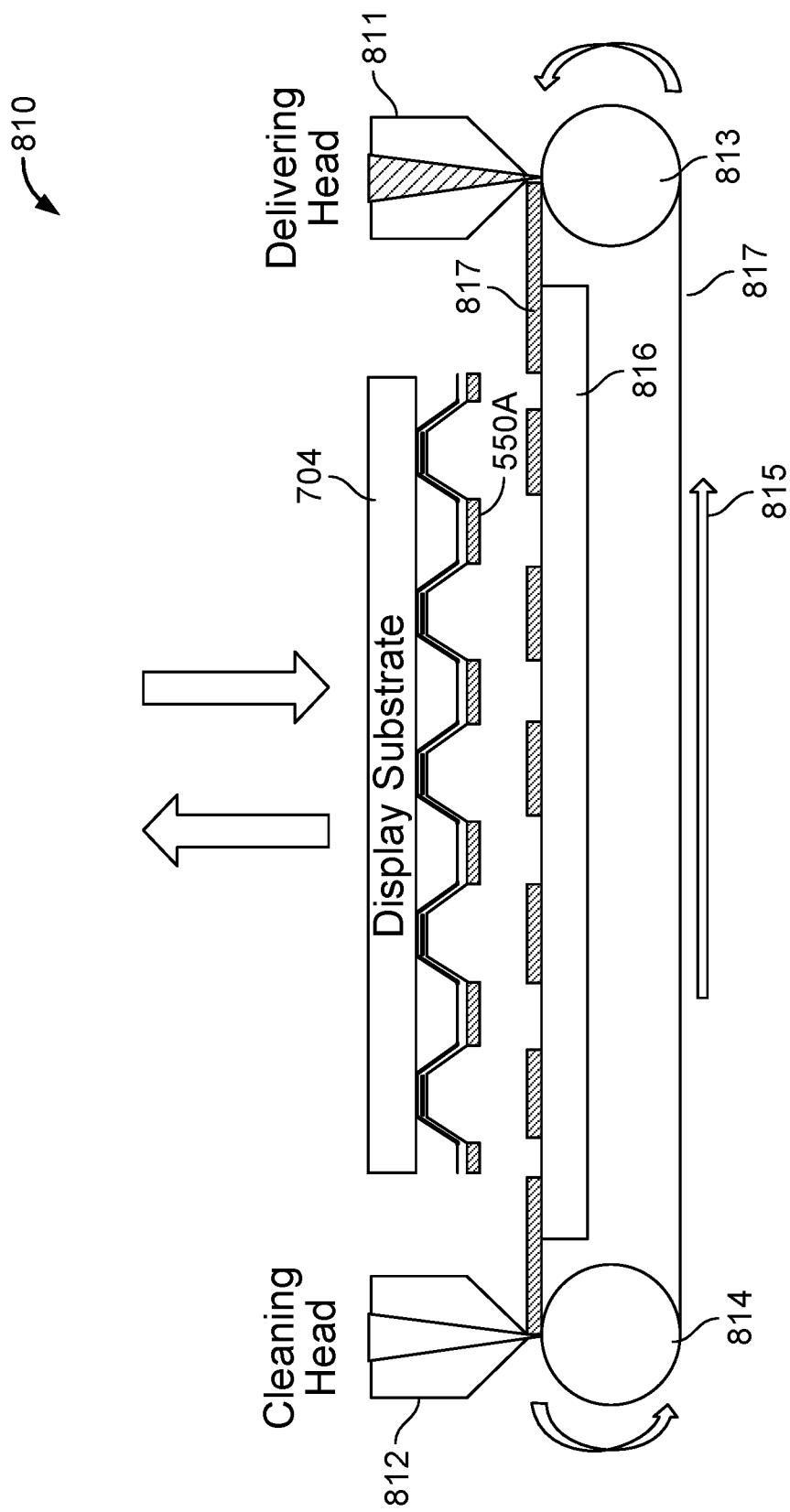

FIG. 8A to 8B show examples of forming the top surface between neighbor wells by drum printing. As illustrated by example 800 of FIG. 8A, a cylindrical drum 804 is located on display substrate on which an array of well structures are formed. The bottom of cylindrical drum 804 can be positioned to be in surface contact with the plateau areas (such as plateau 105) of the array of well structures. As the cylindrical drum 804 spins, droplets of coating material may be sprayed from delivering head 801 onto the drum 804, which carries the coating material to a drying zone 803. Thereafter the coating is carried by the rotating drum 804 into contact with the plateau areas of the well structures. Once the coating is printed on the plateau areas, the hydrophobic top surface 550 is coated. Thereafter, the drum will rotate so that any coating remaining on the drum will reach a cleaning head 802. The cleaning head 802 can clean the drum to remove residual coating material.

Another example 810 of FIG. 8B shows a drum 816 for forming top surface 550 that is non-wetting (hydrophobic) to the filler ink droplet. Drum 816 has a belt structure 817 that moves in direction 815 driven by wheels 813 and 814. In this example 810, delivering head 811 may spray droplets of coating material on belt structure 817. The coating material may then be transferred to the plateau areas of the array of well structures on substrate 704. In some cases, the coating process may be a semi-continuous process that includes the steps of: (1) coating the source substrate as the drum rolls, (2) pause under the display substrate when the coating area of the source substrate can cover the full display substrate, (3) execute a stamp transfer process, and (4) clean and recoat the source substrate for the next substrate. This semi-continuous process is comparable to the example in FIG. 7.

Figure 9A:
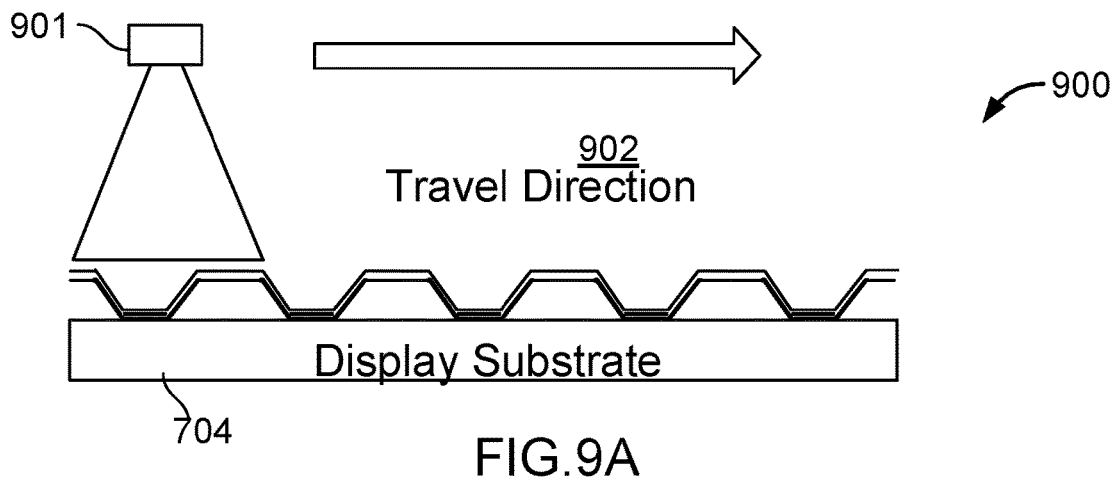
FIGS. 9A to 9C show an example of slot-die filling with filler ink of index matching material based on the top surface with hydrophobic coating.
Figure 9B:
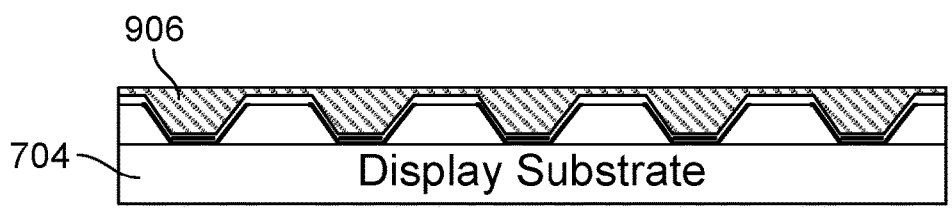
Figure 9C:
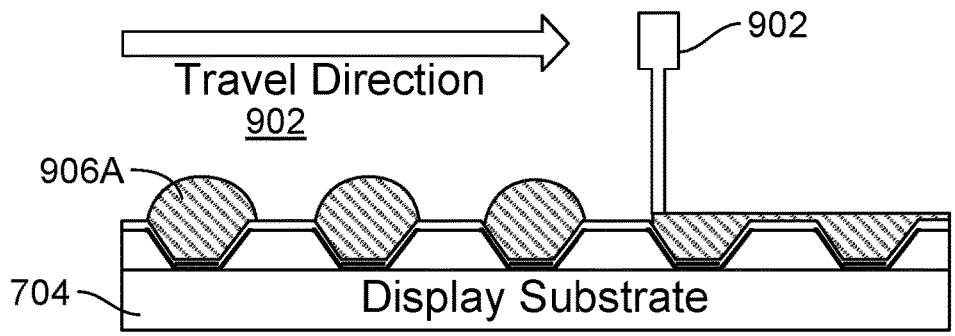

The hydrophobic top surface can be advantageously used during manufacturing. FIGS. 9A to 9C show an example 900 of slot-die filling with filler ink of index matching material. In this example 900, nozzle head 901 moves along direction 902 to coat substrate 704 with filler ink, as illustrated in FIG. 9A. As a result, the filler ink fills the wells of the array on substrate 704 and covers the top surface 550 between neighboring wells, as shown in FIG. 9B.

Thereafter, as illustrated in FIG. 9C, an air blade 903 may move along direction 902 and sweep across the length of the display substrate 704. The air blade 903 can extend across the width of the substrate 704. The air blade blows a jet of air 904 toward the substrate 704. The air jet 904 can be strong enough to dislodge the thin layer of filler ink located over the top surface of the plateaus 550, while leaving filler ink in the wells 103. Once this is performed, the filler ink can remain removed from the top surface 550 (by virtue of surface tension of ink droplets on a hydrophobic surface) and can accumulate over the well regions. This can cause the filler ink to form forming convex surfaces 906A over each well structure. In some cases, multiple passes of air blade treatment may be used for process perfection. The filler ink 905 can be cured after the air blade treatment so that the filler material retains a convex shape 906A over the well structures. As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An organic light-emitting diode (OLED) structure comprising:
    a substrate;
    a dielectric layer on the substrate having an array of well structures, wherein each well structure includes a recess with side walls and a floor, and the recesses are separated by plateaus having rounded top surfaces, and wherein the plateaus are rounded across an entirety of a width between side walls of adjacent well structures;
    a stack of OLED layers covering at least the floor of the recess; and
    a light extraction layer (LEL) in the well over the stack of OLED layers, wherein the rounded top surfaces have a radius of curvature sufficient for a droplet of material for the light extraction layer to slide from the plateaus to the recess.

2. The structure of claim 1, comprising a UV-blocking layer disposed between the stack of OLED layers and the light extraction layer.

3. The structure of claim 2, wherein the UV-blocking layer extends over the rounded top surfaces of the plateaus.

4. An organic light-emitting diode (OLED) structure comprising:
    a substrate;
    a dielectric layer on the substrate having an array of well structures, wherein each well structure includes a recess with side walls and a floor, and the recesses are separated by plateaus having rounded top surfaces, wherein the plateaus include a flat section and rounded corners between the flat section and the side wall of the recess, a stack of OLED layers covering at least the floor of the recess; and a light extraction layer (LEL) in the well over the stack of OLED layers.

5. The structure of claim 4, wherein the rounded corners have a radius of curvature sufficient for a droplet of material for the light extraction layer to slide from the plateaus to the recess.

6. The structure of claim 4, wherein a peak of the rounded top surface of each rounded plateau is about 5 to 50% higher than the depth of the recess.

7. The structure of claim 4, comprising a UV-blocking layer disposed between the stack of OLED layers and the light extraction layer.

8. The structure of claim 7, wherein the UV-blocking layer extends over the rounded corners of the plateaus.

* * * * *